United States Patent
Shi et al.

(10) Patent No.: US 9,893,132 B2
(45) Date of Patent: Feb. 13, 2018

(54) OLED DISPLAY DEVICE AND MANUFACTURE METHOD THEREOF

(71) Applicant: Shenzhen China Star Optoelectronics Technology Co., Ltd., Shenzhen, Guangdong (CN)

(72) Inventors: Longqiang Shi, Guangdong (CN); Yifan Wang, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 159 days.

(21) Appl. No.: 14/424,965

(22) PCT Filed: Feb. 9, 2015

(86) PCT No.: PCT/CN2015/072506
§ 371 (c)(1),
(2) Date: Feb. 27, 2015

(87) PCT Pub. No.: WO2016/090752
PCT Pub. Date: Jun. 16, 2016

(65) Prior Publication Data
US 2016/0343785 A1    Nov. 24, 2016

(30) Foreign Application Priority Data
Dec. 8, 2014    (CN) .......................... 2014 1 0742800

(51) Int. Cl.
*H01L 27/32*    (2006.01)
*H01L 51/00*    (2006.01)
(Continued)

(52) U.S. Cl.
CPC ...... *H01L 27/3253* (2013.01); *H01L 27/3246* (2013.01); *H01L 27/3248* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2003/0160247 A1* | 8/2003 | Miyazawa | H05B 33/22 257/79 |
| 2003/0201445 A1* | 10/2003 | Park | H01L 27/3253 257/79 |

* cited by examiner

*Primary Examiner* — Kyoung Lee
*Assistant Examiner* — Ratisha Mehta
(74) *Attorney, Agent, or Firm* — Andrew C. Cheng

(57) ABSTRACT

The present invention provides an OLED display device and a manufacture method thereof, and the OLED display device comprises a first substrate (100), a second substrate (200) spaced and oppositely located with the first substrate (100), a plurality of thin film transistors (101) located at an inner surface of the first substrate (100), a transparent anode (201) located at an inner surface of the second substrate (200), a plurality of partition walls (202) located on the transparent anode (201), transmission holes (203) formed among the partition walls (202), an organic layer (204) located on the transparent anode (201) and in the transmission holes (203), a metal cathode (205) located on the organic layer (204) and the partition walls (202), and the metal cathode (205) is electrically connected to a drain of the thin film transistor (101). The OLED display device possesses a high aperture ratio and high transmittance. The manufacture method of the OLED display device provided by the present invention can manufacture an OLED display device with a high aperture ratio and high transmittance, and promote the yield and the productivity.

8 Claims, 4 Drawing Sheets

(51) Int. Cl.
*H01L 51/52* (2006.01)
*H01L 51/56* (2006.01)
(52) U.S. Cl.
CPC ...... *H01L 51/0024* (2013.01); *H01L 51/5206* (2013.01); *H01L 51/5221* (2013.01); *H01L 51/56* (2013.01); *H01L 27/3262* (2013.01); *H01L 2227/323* (2013.01); *H01L 2251/301* (2013.01); *H01L 2251/308* (2013.01); *H01L 2251/558* (2013.01)

step 1, forming a thin film transistor (101), comprising a gate (101a), a source metal layer (101b), a drain metal layer (101c) on a first substrate, wherein a thickness of the source metal layer (101b) is smaller than a thickness of the drain metal layer (101c);

step 2, forming a passivation layer (103) on the source metal layer (101b), the drain metal layer (101c) and the first substrate (100), and a concave area (101d) of the passivation layer (103) and a convex area (101e) adjacent to the concave area (101d) is formed by a formation process; wherein a bottom of the concave area (101d) is aligned with a top surface of the drain metal layer (101c) and higher than a top surface of the source metal layer (101b) to expose a part of the drain metal layer (101c);

step 3, forming a transparent anode (201) on a second substrate (200);

step 4, forming partition walls (202) on the transparent anode (201), and the partition walls (202) comprise a plurality of transmission holes (203) corresponding to all pixel areas;

step 5, forming an organic layer (204) in the transmission holes (203) on the transparent anode (201);

step 6, forming a metal cathode (205) on the organic layer (204) and the partition walls (202);

step 7, laminating the first substrate (100) and the second substrate (200), and the metal anode (205) on the organic layer (204) correspondingly joints into the concave area (101d) and fits the bottom of the concave area (101d), and the metal cathode (205) is connected to the drain metal layer (101c) via the concave area (101d).

Fig. 3

OLED DISPLAY DEVICE AND MANUFACTURE METHOD THEREOF

FIELD OF THE INVENTION

The present invention relates to a display technology field, and more particularly to an OLED display device and a manufacture method thereof.

BACKGROUND OF THE INVENTION

The Organic Light Emitting Diode (OLED) is a flat panel display technology which has great prospects for development. It does not only possess extremely excellent display performance but also properties of self-illumination, simple structure, ultra thin, fast response speed, wide view angle, low power consumption and capability of realizing flexible display, and therefore is considered as "dream display". It has been favored by respective big display makers and has become the main selection of the third generation display element.

An OLED display generally comprises a substrate, an anode located on the substrate, an organic emitting layer located on the anodes, an electron transport layer located on the organic emitting layer, and a cathode located on the electron transport layer. As working, the Hole from the anode and the Electron from the cathode are injected to the organic emitting layer, these electrons and holes are combined to generate excited electron-hole pairs, and the excited electron-hole pairs are converted from the excited state to the ground state for achieving illumination.

The OLED can be categorized as Passive matrix OLED (PMOLED) and (Active matrix OLED) AMOLED according to their driving types. The power consumption of the PMOLED is high, and thus, it hinders the application in large scale display devices. Besides, in PMOLED, the aperture ratio is decreased along with the amount increase of the wirings. Therefore, the PMOLED is generally applied for the small scale display devices. The lighting efficiency of the AMOLED is high, and therefore, it is generally utilized for the large scale display devices of high resolution.

On the other hand, the AMOLEDs can be categorized into bottom emitting AMOLED display devices and top emitting AMOLED display devices according to the emitting direction of the light from the organic emitting layer.

Please refer to FIG. 1. FIG. 1 is a sectional diagram of a bottom emitting AMOLED display device according to prior art. As shown in FIG. 1, the AMOLED display device comprises a first substrate 10 and a second substrate 20, which are separated and oppositely faced. A plurality of thin film transistors T and a plurality of first electrodes 31 are formed on an inner surface of the first substrate 10, wherein each first electrode 31 is connected to one thin film transistor T, and an organic layer 32 is formed on the first electrodes 31 and the thin film transistors T, and second electrodes 33 are formed on the organic layer 32. The organic layer 32 in one pixel P emits lights of three colors: red light R, green light G and blue light B. The AMOLED display device further comprises: a dryer 21 formed on the inner surface of the second substrate 20, and employed to remove the water and the air which possibly invade in the spaced room between the first, the second substrates 10, 20. The seal 12 is formed between the first, the second substrates 10, 20, and surrounds elements like, the first, the second electrodes 31, 33, the organic layer 32, the thin film transistors T for protecting the aforesaid elements away from the foreign water and the air.

In the bottom emitting AMOLED display device shown in FIG. 1, the light emits passing through the bottom where the thin film transistors are formed, and it has descended aperture ratio by being compared with the top emitting AMOLED display device. On the other hands, the top emitting AMOLED display device possesses higher aperture ratio but the cathode is generally built on the organic layer. The selection of the material for manufacturing the cathode is restricted. Thus, the transmittance is restricted and display effect is degraded.

SUMMARY OF THE INVENTION

An objective of the present invention is to provide an OLED display device, having a top emitting mode with a high transmittance and a high aperture ratio.

Another objective of the present invention is to provide a manufacture method of an OLED display device, capable of promoting the yield and the productivity.

For realizing the aforesaid objectives, the present invention first provides an OLED display device, comprising: a first substrate, a second substrate spaced and oppositely located with the first substrate, a plurality of thin film transistors located at an inner surface of the first substrate, a transparent anode located at an inner surface of the second substrate, a plurality of partition walls located on the transparent anode, transmission holes formed among the partition walls, an organic layer located on the transparent anode and in the transmission holes, a metal cathode located on the organic layer and the partition walls, and the metal cathode is electrically connected to a drain of the thin film transistor.

The thin film transistor comprises a gate, a source metal layer and a drain metal layer, and a thickness of the source metal layer is smaller than a thickness of the drain metal layer; a passivation layer is further located on the source metal layer, the drain metal layer and the first substrate, and the passivation layer comprises a concave area and a convex area adjacent to the concave area, and a bottom of the concave area is aligned with a top surface of the drain metal layer and higher than a top surface of the source metal layer to expose a part of the drain metal layer, and the metal anode on the organic layer correspondingly joints into the concave area and fits the bottom of the concave area, and the metal cathode is connected to the drain metal layer via the concave area.

Material of the transparent anode is Indium Tin Oxide.

Material of the metal cathode is one of calcium, aluminum and magnesium.

The organic layer comprises a Hole Transporting Layer contacting the transparent anode, an Electron Transport Layer contacting the metal cathode and an emitting layer located between the Hole Transporting Layer and the Electron Transport Layer.

The present invention further provides a manufacture method of an OLED display device, comprising steps of:

step 1, forming thin film transistors, comprising a gate, a source metal layer, a drain metal layer on a first substrate, wherein a thickness of the source metal layer is smaller than a thickness of the drain metal layer;

step 2, forming a passivation layer on the source metal layer, the drain metal layer and the first substrate, and a concave area of the passivation layer and a convex area adjacent to the concave area is formed by a formation process;

wherein a bottom of the concave area is aligned with a top surface of the drain metal layer and higher than a top surface of the source metal layer to expose a part of the drain metal layer;

step 3, forming a transparent anode on a second substrate;

step 4, forming partition walls on the transparent anode, and the partition walls comprise a plurality of transmission holes corresponding to all pixel areas;

step 5, forming an organic layer in the transmission holes on the transparent anode;

step 6, forming a metal cathode on the organic layer and the partition walls;

step 7, laminating the first substrate and the second substrate, and the metal anode on the organic layer correspondingly joints into the concave area and fits the bottom of the concave area, and the metal cathode is connected to the drain metal layer via the concave area.

As manufacturing respective elements, the concave area of the passivation layer is designed to correspond to a position of the metal cathode on the organic layer, and an area of the concave area is larger than or equal to an area of the metal cathode on the organic layer, and the metal cathode on the organic layer can be completely jointed in the concave area of the passivation layer as oppositely assembling the first substrate and the second substrate.

In the step 3, material of the transparent anode is Indium Tin Oxide.

In the step 5, material of the metal cathode is one of calcium, aluminum and magnesium.

In the step 56, the organic layer comprises a Hole Transporting Layer contacting the transparent anode, an Electron Transport Layer contacting the metal cathode and an emitting layer located between the Hole Transporting Layer and the Electron Transport Layer.

The present invention further provides an OLED display device, comprising: a first substrate, a second substrate spaced and oppositely located with the first substrate, a plurality of thin film transistors located at an inner surface of the first substrate, a transparent anode located at an inner surface of the second substrate, a plurality of partition walls located on the transparent anode, transmission holes formed among the partition walls, an organic layer located on the transparent anode and in the transmission holes, a metal cathode located on the organic layer and the partition walls, and the metal cathode is electrically connected to a drain of the thin film transistor.

wherein the thin film transistor comprises a gate, a source metal layer and a drain metal layer, and a thickness of the source metal layer is smaller than a thickness of the drain metal layer; a passivation layer is further located on the source metal layer, the drain metal layer and the first substrate, and the passivation layer comprises a concave area and a convex area adjacent to the concave area, and a bottom of the concave area is aligned with a top surface of the drain metal layer and higher than a top surface of the source metal layer to expose a part of the drain metal layer, and the metal anode on the organic layer correspondingly joints into the concave area and fits the bottom of the concave area, and the metal cathode is connected to the drain metal layer via the concave area;

wherein the organic layer comprises a Hole Transporting Layer contacting the transparent anode, an Electron Transport Layer contacting the metal cathode and an emitting layer located between the Hole Transporting Layer and the Electron Transport Layer.

The benefits of the present invention are: the present invention provides an OLED display device and a manufacture method thereof. By forming the thin film transistors on the first substrate, and forming the organic layer and transparent anode on the second substrate, the transparent anode is located on the metal cathode and transparent, therefore, the selection of the cathode material is not influenced. Thus, the OLED display device is a top emitting type with high transmittance and a high aperture ratio. The manufacture method of an OLED display device provided by the present invention can manufacture an OLED display device with a high aperture ratio and high transmittance, and promote the yield and the productivity.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings,

FIG. 3 is a flowchart of a manufacture method of an OLED display device according to the present invention;

DETAILED DESCRIPTION OF PREFERRED EMBODIMENTS

For better explaining the technical solution and the effect of the present invention, the present invention will be further described in detail with the accompanying drawings and the specific embodiments.

Figure 1:
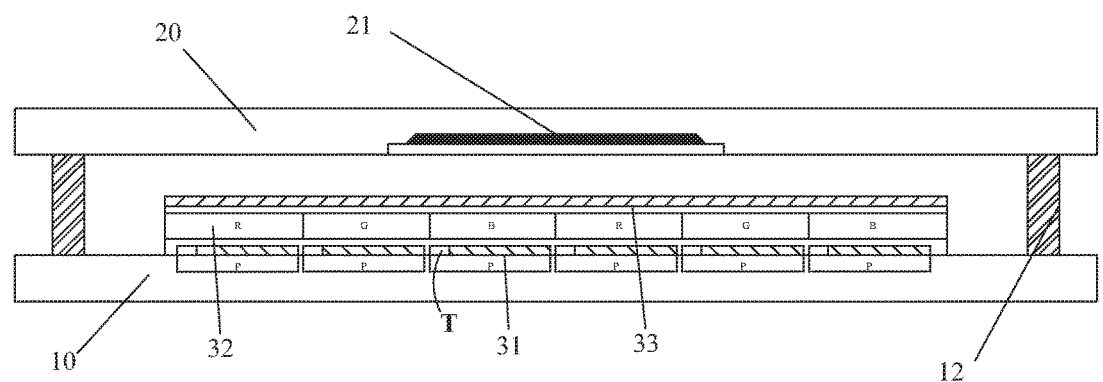
FIG. 1 is a sectional diagram of a bottom emitting AMOLED display device according to prior art.
Figure 2:
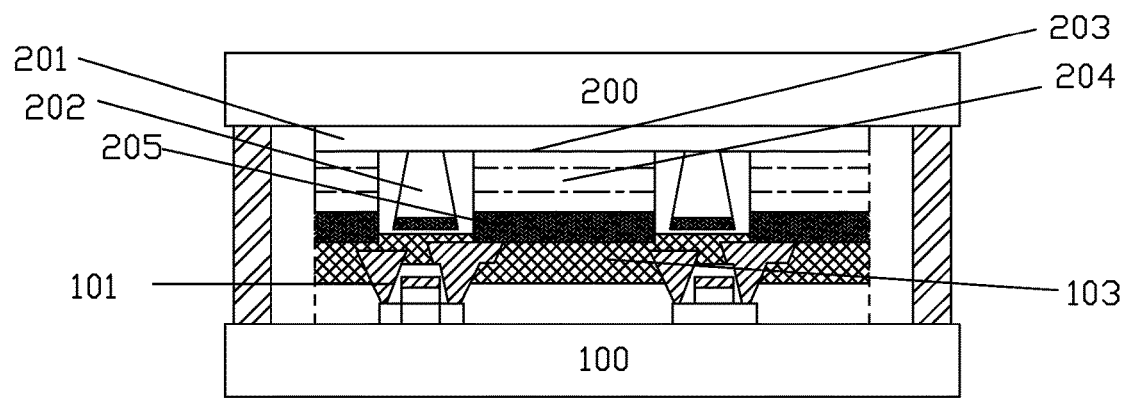
FIG. 2 is a sectional diagram of an OLED display device according to the present invention.
Figure 4:
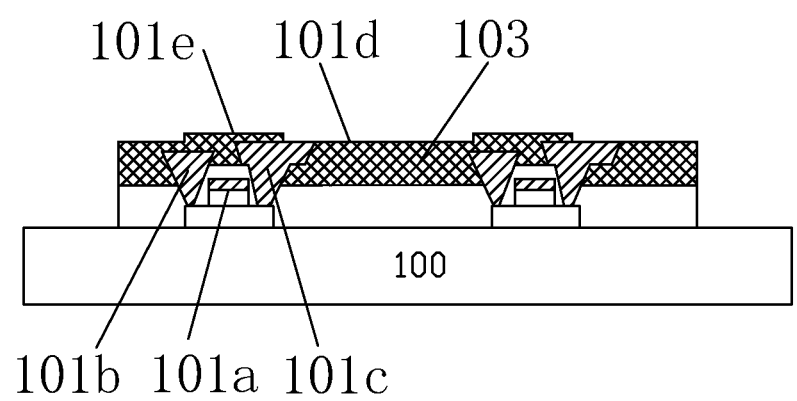
FIG. 4 is a sectional diagram of a thin film transistor and a passivation layer according to the present invention.

Please refer to FIG. 2 and FIG. 4. The present invention provides an OLED display device, comprising a first substrate 100, a second substrate 200 spaced and oppositely located with the first substrate 100, a plurality of thin film transistors 101 located at an inner surface of the first substrate 100, a transparent anode 201 located at an inner surface of the second substrate 200, a plurality of partition walls 202 located on the transparent anode 201, transmission holes 203 formed among the partition walls 202, an organic layer 204 located on the transparent anode 201 and in the transmission holes 203, a metal cathode 205 located on the organic layer 204 and the partition walls 202, and the metal cathode 205 is electrically connected to a drain of the thin film transistor 101.

The thin film transistor 101 comprises a gate 101a, a source metal layer 101b and a drain metal layer 101c, and a thickness of the source metal layer 101b is smaller than a thickness of the drain metal layer 101c; a passivation layer 103 is further located on the source metal layer 101b, the drain metal layer 101c and the first substrate 100, and the passivation layer 103 comprises a concave area 101d and a convex area 101e adjacent to the concave area 101d, and a bottom of the concave area 101d is aligned with a top surface of the drain metal layer 101c and higher than a top surface of the source metal layer 101b to expose a part of the drain metal layer 101c, and the metal anode 205 on the organic layer 204 correspondingly joints into the concave area 101d and fits the bottom of the concave area 101d, and the metal cathode 205 is connected to the drain metal layer 101c via the concave area 101d.

Specifically, a contact width of the partition wall 202 with the transparent anode 201 is smaller than a contact width with the metal cathode 205. Material of the transparent anode 201 is Indium Tin Oxide. Material of the metal cathode 205 is one of calcium, aluminum and magnesium. The organic layer 204 comprises a Hole Transporting Layer contacting the transparent anode 201, an Electron Transport Layer contacting the metal cathode 205 and an emitting layer located between the Hole Transporting Layer and the Electron Transport Layer. The voltage between the transparent anode 201 and the metal cathode 205 is controlled according to the control signals received by the thin film transistor 101 to make the organic layer 204 illuminate. The emitting light goes out by passing through the transparent anode 201 or goes out by passing through the transparent anode 201 after being reflected by the metal cathode 205. Thus, the OLED display device of the present invention is a top emitting OLED display device with a specific high aperture ratio.

Please refer to FIG. 3 and FIG. 4. The present invention further provides a manufacture method of an OLED display device, comprising:

step 1, forming a thin film transistor 101, comprising a gate 101a, an active layer, a source 101b and a drain 101c on the first substrate 100;

The specific step is: forming a Poly-silicon layer on the first substrate 100, and the Poly-silicon layer comprises an active layer, a source area, a drain area at two ends of the active layer, and covering an insulative layer on the Poly-silicon layer, and the insulative layer covers the entire active layer, a part of the source area and a part of the drain area, and forming the gate 101a on the insulative layer of the active layer, and starting to coat metal layer on the exposed parts of the source area and the drain area to make the metal layer formed for forming the source metal layer 101b and the drain metal layer 101c, and a thickness of the source metal layer 101b is smaller than a thickness of the drain metal layer 101c.

step 2, forming a passivation layer 103 on the source metal layer 101b, the drain metal layer 101c and the first substrate 100, and a concave area 101d of the passivation layer 103 and a convex area 101e adjacent to the concave area 101d is formed by a formation process;

a bottom of the concave area 101d is aligned with a top surface of the drain metal layer 101c and higher than a top surface of the source metal layer 101b to expose a part of the drain metal layer 101c;

step 3, forming a transparent anode 201 on a second substrate 200;

In the step 3, material of the transparent anode 201 is Indium Tin Oxide.

step 4, forming partition walls 202 on the transparent anode 201, and the partition walls 202 comprise a plurality of transmission holes 203 corresponding to all pixel areas;

Material of the partition walls 202 is organic material or inorganic material, and it can be formed as: a bottom contact width of the partition wall 202 with the transparent anode 201 is bigger than a top contact width with the metal cathode 205.

step 5, forming an organic layer 204 in the transmission holes 203 on the transparent anode 201;

In the step 5, the organic layer 204 comprises a Hole Transporting Layer contacting the transparent anode 201, an Electron Transport Layer contacting the metal cathode 205 and an emitting layer located between the Hole Transporting Layer and the Electron Transport Layer. The organic layer 204 can emit lights of three colors of red, green and blue. A height of the organic layer 204 is lower than heights of the partition walls 202.

step 6, forming a metal cathode 205 on the organic layer 204 and the partition walls 202;

In the step 6, material of the metal cathode 205 is one of calcium, aluminum and magnesium.

step 7, laminating the first substrate 100 and the second substrate 200, and the metal anode 205 on the organic layer 204 correspondingly joints into the concave area 101d and fits the bottom of the concave area 101d, and the metal cathode 205 is connected to the drain metal layer 101c via the concave area 101d.

As manufacturing respective elements, the concave area 101d of the passivation layer 103 is designed to correspond to a position of the metal cathode 205 on the organic layer 204, and an area of the concave area 101d is larger than or equal to an area of the metal cathode 205 on the organic layer 204, and the metal cathode 205 on the organic layer 204 can be completely jointed in the concave area 101d of the passivation layer 103 as oppositely assembling the first substrate and the second substrate.

In the OLED display device and the manufacture method thereof provided by the present invention, by forming the thin film transistors on the first substrate, and forming the organic layer and transparent anode on the second substrate, the transparent anode is located on the metal cathode and transparent, therefore, the selection of the cathode material is not influenced. Thus, the OLED display device is a top emitting type with high transmittance and a high aperture ratio. The manufacture method of an OLED display device provided by the present invention can manufacture an OLED display device with a high aperture ratio and high transmittance, and promote the yield and the productivity.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An OLED display device, comprising: a first substrate, a second substrate spaced and oppositely located with the first substrate, a plurality of thin film transistors located at an inner surface of the first substrate, a transparent anode located at an inner surface of the second substrate, a plurality of partition walls located on the transparent anode, transmission holes formed among the partition walls, an organic layer located on the transparent anode and arranged in each of the transmission holes, and a metal cathode located on the organic layer and the partition walls, wherein the thin film transistors comprise a passivation layer formed thereon and the passivation layer comprises a concave area corresponding to each of the thin film transistors such that a part of a drain metal layer is exposed on a bottom of the concave area, wherein the concave area is defined between two convex areas of the passivation layer such that a portion of the metal cathode that is located on the organic layer is received in the concave area and fit between the two convex areas to electrically connect with the part of the drain metal layer exposed on the bottom of the concave area.

2. The OLED display device according to claim 1, wherein each of the thin film transistors comprises a gate, a source metal layer and the drain metal layer, and a thickness of the source metal layer is smaller than a thickness of the drain metal layer; the passivation layer is located on the source metal layer, the drain metal layer and the first substrate, and the passivation layer comprises a concave area and a convex area adjacent to the concave area, and the bottom of the concave area corresponds, in position, to a top surface of the drain metal layer and is higher than a top surface of the source metal layer so as to expose the part of the drain metal layer.

3. The OLED display device according to claim 1, wherein a material of the transparent anode is Indium Tin Oxide.

4. The OLED display device according to claim 1, wherein a material of the metal cathode is one of calcium, aluminum and magnesium.

5. The OLED display device according to claim 1, wherein the organic layer comprises a Hole Transporting Layer contacting the transparent anode, an Electron Transport Layer contacting the metal cathode and an emitting layer located between the Hole Transporting Layer and the Electron Transport Layer.

6. An OLED display device, comprising: a first substrate, a second substrate spaced and oppositely located with the first substrate, a plurality of thin film transistors located at an inner surface of the first substrate, a transparent anode located at an inner surface of the second substrate, a plurality of partition walls located on the transparent anode, transmission holes formed among the partition walls, an organic layer located on the transparent anode and arranged in each of the transmission holes, and a metal cathode located on the organic layer and the partition walls;

wherein each of the thin film transistors comprises a gate, a source metal layer and a drain metal layer, and a thickness of the source metal layer is smaller than a thickness of the drain metal layer; a passivation layer is further located on the source metal layer, the drain metal layer and the first substrate, and the passivation layer comprises a concave area corresponding to each of the thin film transistors and convex areas adjacent to the concave area such that the concave area is defined between two convex areas adjacent to the concave area, and a bottom of the concave area corresponds, in position, to a top surface of the drain metal layer and is higher than a top surface of the source metal layer so as to expose a part of the drain metal layer on the bottom of the concave area, and the metal anode on the organic layer correspondingly joints into the concave area and fits the bottom of the concave area, and a portion of the metal cathode that is located on the organic layer is received in the concave area and fit between the two convex areas to electrically connect with the part of the drain metal layer exposed on the bottom of the concave area;

wherein the organic layer comprises a Hole Transporting Layer contacting the transparent anode, an Electron Transport Layer contacting the metal cathode and an emitting layer located between the Hole Transporting Layer and the Electron Transport Layer.

7. The OLED display device according to claim 6, wherein a material of the transparent anode is Indium Tin Oxide.

8. The OLED display device according to claim 6, wherein a material of the metal cathode is one of calcium, aluminum and magnesium.

* * * * *